(12) United States Patent
Reznicek et al.

(10) Patent No.: US 10,580,977 B2
(45) Date of Patent: Mar. 3, 2020

(54) TIGHTLY INTEGRATED 1T1R RERAM FOR PLANAR TECHNOLOGY

(71) Applicant: International Business Machines Corporation, Armonk, NY (US)

(72) Inventors: Alexander Reznicek, Troy, NY (US); Takashi Ando, Tuckahoe, NY (US); Pouya Hashemi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/044,077

(22) Filed: Jul. 24, 2018

(65) Prior Publication Data

US 2020/0035915 A1 Jan. 30, 2020

(51) Int. Cl.

| | | |
|---|---|---|
| *H01L 45/00* | (2006.01) | |
| *H01L 29/08* | (2006.01) | |
| *H01L 23/532* | (2006.01) | |
| *H01L 27/24* | (2006.01) | |

(52) U.S. Cl.
CPC ...... *H01L 45/1206* (2013.01); *H01L 23/5329* (2013.01); *H01L 27/2463* (2013.01); *H01L 29/0847* (2013.01); *H01L 45/1253* (2013.01); *H01L 45/145* (2013.01); *H01L 45/1616* (2013.01); *H01L 45/1625* (2013.01); *H01L 45/1675* (2013.01)

(58) Field of Classification Search
CPC ............. H01L 45/1206; H01L 45/1253; H01L 45/145; H01L 45/1616; H01L 45/1625; H01L 45/1675
See application file for complete search history.

(56) References Cited

U.S. PATENT DOCUMENTS

| | | | |
|---|---|---|---|
| 7,012,273 B2* | 3/2006 | Chen | H01L 27/2436 257/2 |
| 7,488,981 B2* | 2/2009 | Jeong | H01L 45/1273 257/68 |
| 8,154,003 B2 | 4/2012 | Lee et al. | |
| 9,036,400 B2 | 5/2015 | Lu | |
| 9,159,916 B2 | 10/2015 | Chang et al. | |

(Continued)

FOREIGN PATENT DOCUMENTS

| | | |
|---|---|---|
| CN | 101295645 A | 10/2008 |
| CN | 101345216 A | 1/2009 |

OTHER PUBLICATIONS

Chien, W.C., et al., "A Forming-free WOX Resistive Memory Using a Novel Self-aligned Field Enhancement Feature with Excellent Reliability and Scalability", International Electron Devices Meeting (IEDM), Date of Conference: Dec. 6-8, 2010, pp. 19.2.1-19.2.4.

(Continued)

*Primary Examiner* — Matthew L Reames
(74) *Attorney, Agent, or Firm* — Scully, Scott, Murphy & Presser, P.C.; L. Jeffrey Kelly, Esq.

(57) ABSTRACT

A semiconductor structure includes an oxide ReRAM co-integrated with a drain region of a field effect transistor (FET). The oxide ReRAM has a tip region defined by a pointed cone that contacts a faceted upper surface of the drain region of the FET. Such a tip region enhances the electric field of the oxide ReRAM and thus helps to control forming of the conductive filament of the oxide ReRAM.

10 Claims, 10 Drawing Sheets

(56) References Cited

U.S. PATENT DOCUMENTS

| | | | |
|---|---|---|---|
| 9,178,000 B1 | 11/2015 | Nardi et al. | |
| 9,412,940 B2 | 8/2016 | Sacchetto et al. | |
| 9,673,296 B2* | 6/2017 | Adam | H01L 29/66636 |
| 9,741,765 B1 | 8/2017 | Narayanan et al. | |
| 9,831,288 B2 | 11/2017 | Grenouillet et al. | |
| 10,269,869 B1* | 4/2019 | Ando | H01L 27/2454 |
| 10,283,564 B1* | 5/2019 | Liu | H01L 27/2436 |
| 2007/0018205 A1 | 1/2007 | Chidambarrao et al. | |
| 2009/0127632 A1 | 5/2009 | Pas | |
| 2010/0090289 A1* | 4/2010 | Yang | H01L 21/02433 |
| | | | 257/369 |
| 2013/0270508 A1 | 10/2013 | Li et al. | |
| 2013/0320411 A1 | 12/2013 | Fan et al. | |
| 2016/0276342 A1* | 9/2016 | Lim | H01L 27/0886 |
| 2018/0158928 A1* | 6/2018 | Chen | H01L 21/76224 |
| 2019/0123104 A1* | 4/2019 | Yang | H01L 27/2436 |

OTHER PUBLICATIONS

Pan, H. S., et al., "1Kbit FinFET Dielectric (FIND) RRAM in pure 16nm FinFET CMOS logic process," International Electron Devices Meeting (IEDM), Date of Conference: Dec. 7-9, 2015, pp. 10.5.1-10.5.4.

International Search Report dated Oct. 18, 2019 received in a corresponding foreign application.

* cited by examiner

TIGHTLY INTEGRATED 1T1R RERAM FOR PLANAR TECHNOLOGY

BACKGROUND

The present application relates to a semiconductor structure and a method of forming the same. More particularly, the present application relates to a semiconductor structure that includes an oxide resistive random access memory (ReRAM) co-integrated with a drain region of a field effect transistor (FET).

Many modern day electronic devices contain electronic memory. Electronic memory may be volatile memory or non-volatile memory. Non-volatile memory retains its stored data in the absence of power, whereas volatile memory loses its stored data when power is lost. Resistive random access memory (ReRAM or RRAM) is one promising candidate for the next generation of non-volatile memory due to its simple structure and its compatibility with complementary metal-oxide-semiconductor (CMOS) logic fabrication processes.

For oxide ReRAMs, electroforming of a current conducting filament is needed. This process relies on randomness and thus the position of the filament of the oxide ReRAM is not well controlled. This results in a higher forming voltage as the ReRAM cell is scaled and higher device variability. Also, oxide ReRAMs typically require a current control field effect transistor to form a 1T1R (e.g., one-transistor one-resistive element) structure. This makes the process integration complicated. Co-integration of a FET with an oxide ReRAM in tight spacing is thus needed.

SUMMARY

A semiconductor structure includes an oxide ReRAM co-integrated with a drain region of a field effect transistor (FET). The oxide ReRAM has a tip region defined by a pointed cone that contacts a faceted upper surface of the drain region of the FET. Such a tip region enhances the electric field of the oxide ReRAM and thus helps to control forming of the conductive filament of the oxide ReRAM.

In one aspect of the present application, a semiconductor structure is provided. In one embodiment, the semiconductor structure includes an oxide resistive random access memory (ReRAM) device co-integrated with a field effect transistor (FET), wherein the ReRAM device has a tip region that contacts a faceted upper surface of a drain region of the FET.

In another aspect of the present application, a method of forming a semiconductor structure is provided. In one embodiment, the method includes providing a sacrificial gate structure on a surface of a semiconductor substrate, wherein a first dielectric spacer and a second dielectric spacer laterally surround the sacrificial gate structure. A source region and a drain region are formed in the semiconductor substrate and on opposite sides of the gate structure. The source region and the drain region have faceted sidewall surfaces. A self-limiting etch is then performed on the drain region to provide a faceted upper surface to the drain region, and elements of an oxide resistive random access memory (ReRAM) device are formed in contact with the faceted upper surface of the drain region.

DETAILED DESCRIPTION

Figure 1:
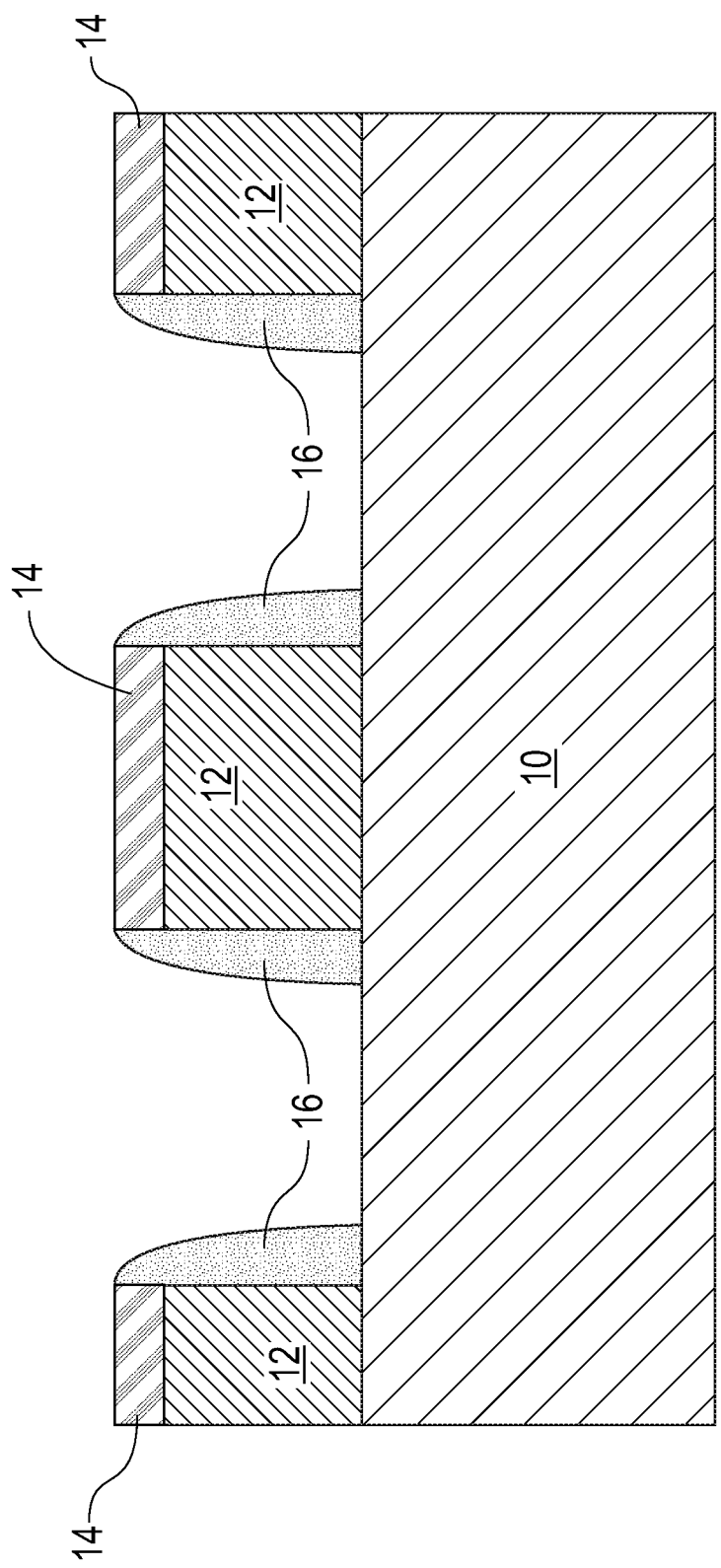
FIG. 1 is a cross sectional view of an exemplary semiconductor structure of the present application during an early stage of fabrication and including a plurality of sacrificial gate structures located on a surface of a semiconductor substrate, wherein a first dielectric spacer laterally surrounds each sacrificial gate structure.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure of the present application during an early stage of fabrication and including a plurality of sacrificial gate structures located on a surface of a semiconductor substrate 10, wherein a first dielectric spacer 16 laterally surrounds each sacrificial gate structure. Although a plurality of sacrificial gate structures are described and illustrated, the present application can be employed when a single sacrificial gate structure is employed.

The semiconductor substrate 10 that can be employed in the present application includes at least one semiconductor material that has semiconducting properties. Examples of semiconductor materials that can be used as the semiconductor substrate 10 include, for example, silicon (Si), a silicon germanium (SiGe) alloy, a silicon germanium carbide (SiGeC) alloy, germanium (Ge), III/V compound semiconductors or II/VI compound semiconductors. In one embodiment, the semiconductor substrate 10 is a bulk semiconductor substrate. The term "bulk semiconductor substrate" denotes a substrate that is composed entirely of one or more semiconductor materials. In one example, the bulk semiconductor substrate is composed entirely of Si.

In some embodiments, the semiconductor substrate 10 is composed of a semiconductor-on-insulator (SOI) substrate. A SOI substrate typically includes a handle substrate, an insulator layer and a topmost semiconductor material layer. In some embodiments, the handle substrate of the SOI substrate may include a semiconductor material, as described above. In other embodiments, the handle substrate may be omitted, or the handle substrate may be composed of a conductive material and/or an insulator material. The insulator layer of the SOI substrate may include a crystalline or non-crystalline dielectric material. In one example, the insulator layer of the SOI substrate may be composed of silicon dioxide and/or boron nitride. The topmost semiconductor layer of the SOI substrate is composed of a semiconductor material, as defined above.

Each sacrificial gate structure typically includes a sacrificial gate material 12 and a sacrificial gate cap material 14. In some embodiments (not shown), each sacrificial gate structure may also include a sacrificial gate dielectric material located beneath the sacrificial gate material 12. In yet other embodiments, the sacrificial gate structures are entirely composed of the sacrificial gate material 12.

The sacrificial gate structures may be formed by a blanket layer (or layers) of a sacrificial material (or various sacrificial materials) and then patterning the sacrificial material (or various sacrificial materials) by lithography and an etch. In one embodiment, the sacrificial gate structures can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate dielectric material. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition.

After forming the blanket layer of sacrificial gate dielectric material, a blanket layer of a sacrificial gate material 12 can be formed on the blanket layer of sacrificial gate dielectric material. The sacrificial gate material 12 can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material 12 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material 12, a blanket layer of a sacrificial gate cap material 14 can be formed. The sacrificial gate cap material 14 may include a hard mask material such as, for example, silicon dioxide and/or silicon nitride. The sacrificial gate cap material 14 can be formed by any suitable deposition process such as, for example, chemical vapor deposition or plasma enhanced chemical vapor deposition. The various blanket layers of sacrificial materials are then patterned by lithography and etching to provide the sacrificial gate structures on the surface of semiconductor substrate 10.

The first dielectric spacers 16 can be formed by deposition of a first dielectric spacer material and then etching the first dielectric spacer material. Illustrative examples of first dielectric spacer materials that may be employed in the present application include, but are not limited to, silicon dioxide, silicon nitride or silicon oxynitrides. In some embodiments, the first dielectric spacer material (and thus the first dielectric spacers 16) and the sacrificial gate cap material are both composed of a same dielectric material such as, for example, silicon nitride. The deposition process that can be employed in providing the first dielectric spacer material includes, for example, chemical vapor deposition (CVD), plasma enhanced chemical vapor deposition (PECVD), or physical vapor deposition (PVD). The etch used to etch the deposited first dielectric spacer material may comprise a dry etching process such as, for example, reactive ion etching.

Figure 2:
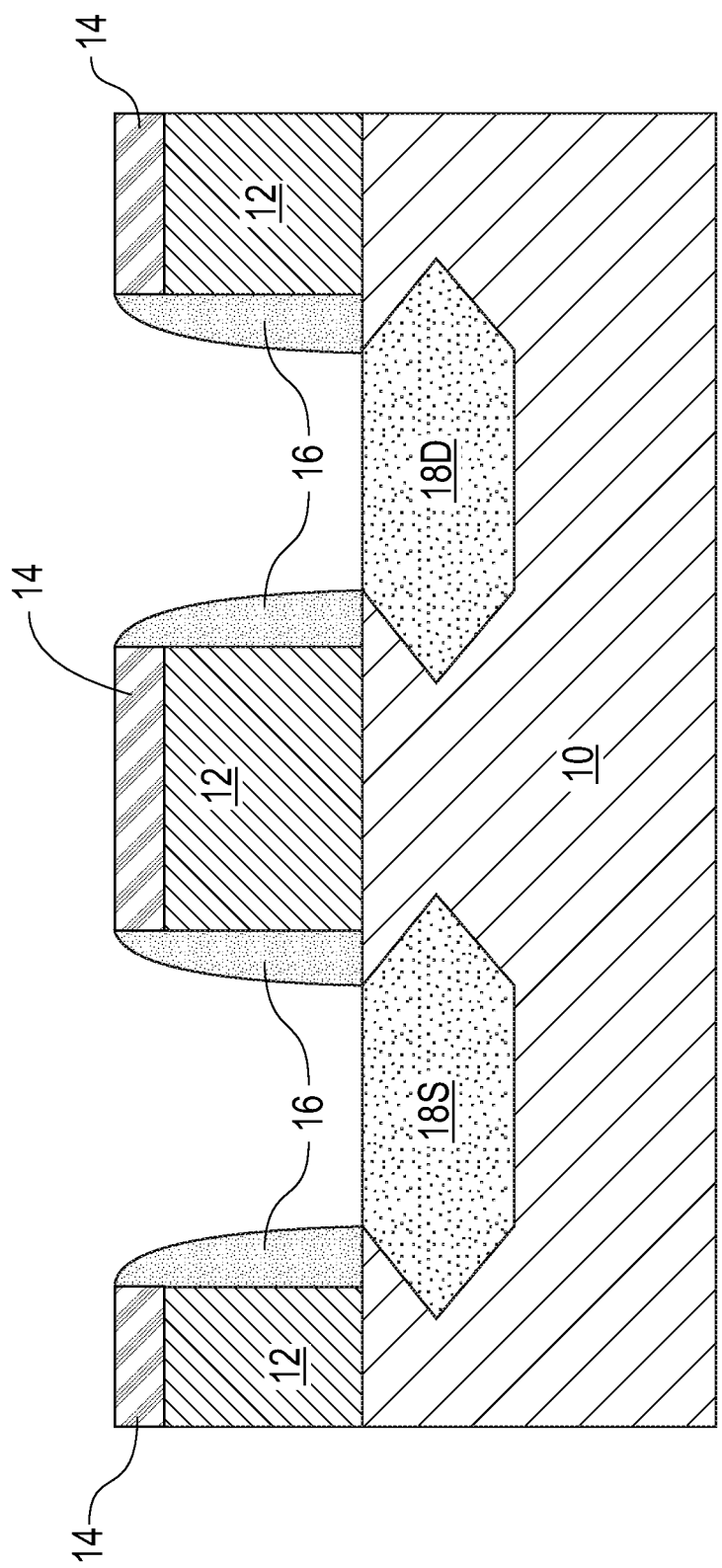
FIG. 2 is a cross sectional view of the exemplary semiconductor structure of FIG. 1 after forming a source region and a drain region in the semiconductor substrate and at a footprint of each sacrificial gate structure.

Referring now to FIG. 2, there is illustrated the exemplary semiconductor structure of FIG. 1 after forming a source region 18S and a drain region 18D in the semiconductor substrate 10 and at a footprint of each sacrificial gate structure. When an SOI substrate is employed, the source region 18S and drain region 18D are formed into the topmost semiconductor layer of the SOI substrate. The source region 18S and drain region 18D can be formed by first performing a self-limiting etch. The term "self-limiting etch" is used throughout the present application to denote an etch that removes certain planes of a material faster than other planes of the same material. For example, a self-limiting etch of silicon removes {100} and/or {110} planes faster than {111} planes. The self-limiting etch may also be referred to herein as a crystallographic etch. One example of a self-limiting etch is a sigma etch. Some illustrative examples of etchants that may be used during the self-limiting etch include tetramethylammonium hydroxide (TMAH), ammonia (NH$_4$OH), and/or potassium hydroxide (KOH). In the present application, this self-limiting etch provides source/drain trenches (and thus the source region 18S and the drain region 18D) having faceted sidewall surfaces. In one embodiment, the source/drain trenches (and thus the source region 18S and the drain region 18D) are sigma shaped.

A doped semiconductor material which provides the source region 18S and the drain region 18D is then formed into each of the source/drain trenches utilizing an epitaxial growth (or deposition) process. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of the doped semiconductor material can be performed utilizing any well known precursor gas or gas mixture. Carrier gases like hydrogen, nitrogen, helium and argon can be used.

The semiconductor material that provides the doped semiconductor material and thus the source region 18S and the drain region 18D may include a same or different semiconductor material than the semiconductor substrate 10. In an example, the doped semiconductor material and the semiconductor substrate 10 are both composed of silicon.

The doped semiconductor material also includes a dopant which is typically introduced into the precursor gas mixture that provides the semiconductor material of the source region 18S and drain region 18D during the epitaxial growth process. The dopant can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the doped semiconductor material provides the source region 18S and the drain region 18D comprises silicon or a silicon germanium alloy that has a dopant concentration of from $4\times10^{20}$ atoms/cm$^3$ to $3\times10^{21}$ atoms/cm$^3$.

Figure 3:
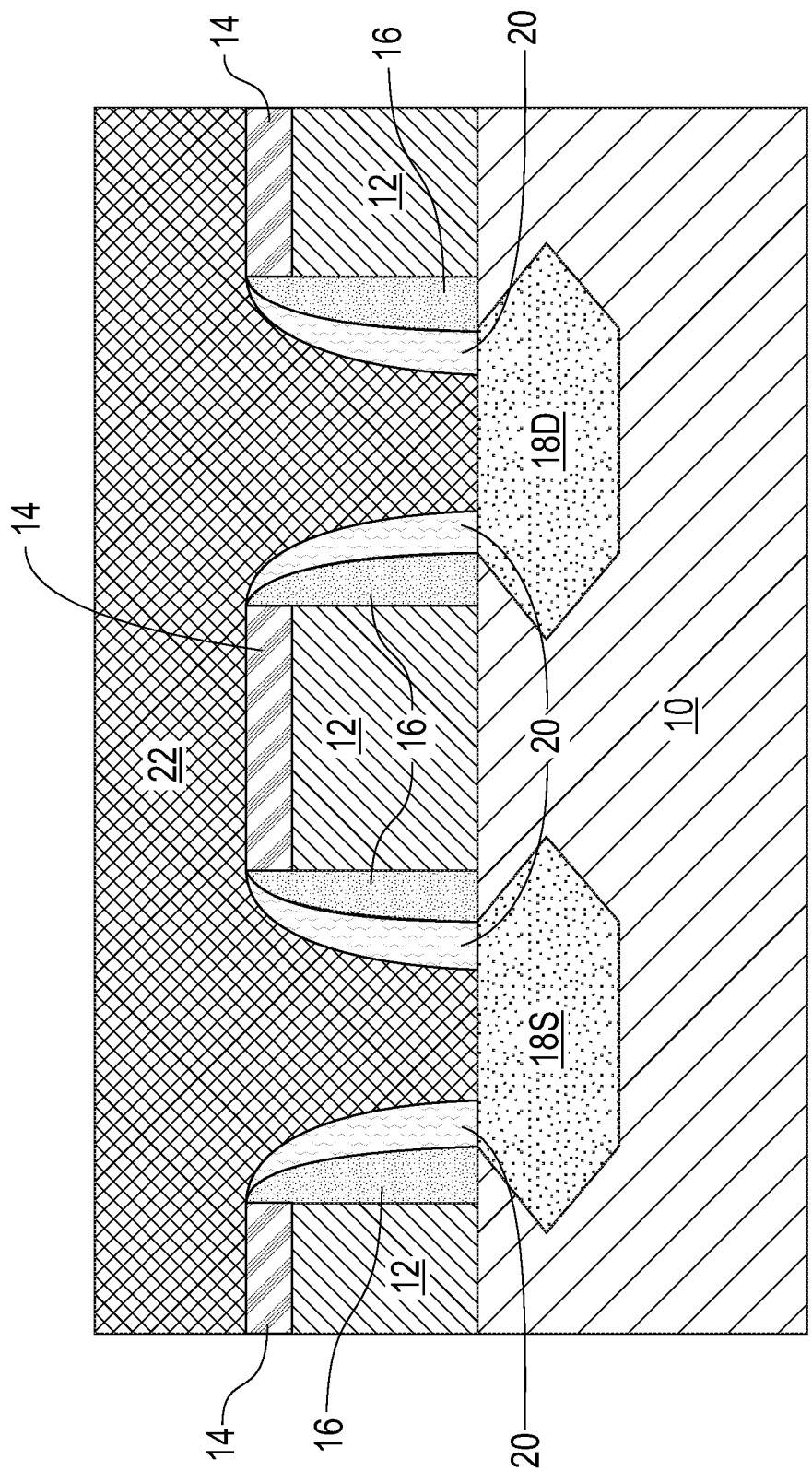
FIG. 3 is a cross sectional view of the exemplary semiconductor structure of FIG. 2 after forming a second dielectric spacer on the first dielectric spacer, and subsequently forming an interlayer dielectric (ILD) material layer.

Referring now to FIG. 3, there is illustrated the exemplary semiconductor structure of FIG. 2 after forming a second dielectric spacer 20 on the first dielectric spacer 16, and subsequently forming an interlayer dielectric (ILD) material layer 22. The second dielectric spacer 20 is formed on an outermost sidewall of the first dielectric spacer 16 and has a bottommost surface that is formed on a portion of the source region 18S or drain region 18D. The ILD material layer 22 laterally surrounds, and is present above, each sacrificial gate structure, and the first and second dielectric spacers (16, 20).

The second dielectric spacer 20 can be formed by deposition of a second dielectric spacer material and then etching the second dielectric spacer material. In some embodiments, the second dielectric spacer material is composed of a different dielectric spacer material than the first dielectric spacer material. In other embodiments, the second dielectric spacer material is composed of a same dielectric spacer material as the first dielectric spacer material. Illustrative examples of second dielectric spacer materials that may be employed in the present application include, but are not limited to, silicon dioxide, silicon nitride or silicon oxynitrides. In one embodiment, the first dielectric spacer material (and thus the first dielectric spacers 16) and the sacrificial gate cap material are both composed of silicon nitride, while the second dielectric spacer material (and thus the second dielectric spacers 20) is composed of silicon dioxide The deposition process that can be employed in providing the second dielectric spacer material includes, for example, chemical vapor deposition (CVD), plasma enhanced chemical vapor deposition (PECVD), or physical vapor deposition (PVD). The etch used to etch the deposited second dielectric spacer material may comprise a dry etching process such as, for example, reactive ion etching.

ILD material layer 22 can be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as ILD material layer 22. In one embodiment, the ILD material layer 22 can be formed utilizing a deposition process including, for example, chemical vapor deposition (CVD), plasma enhanced chemical vapor deposition (PECVD), evaporation or spin-coating.

Figure 4:
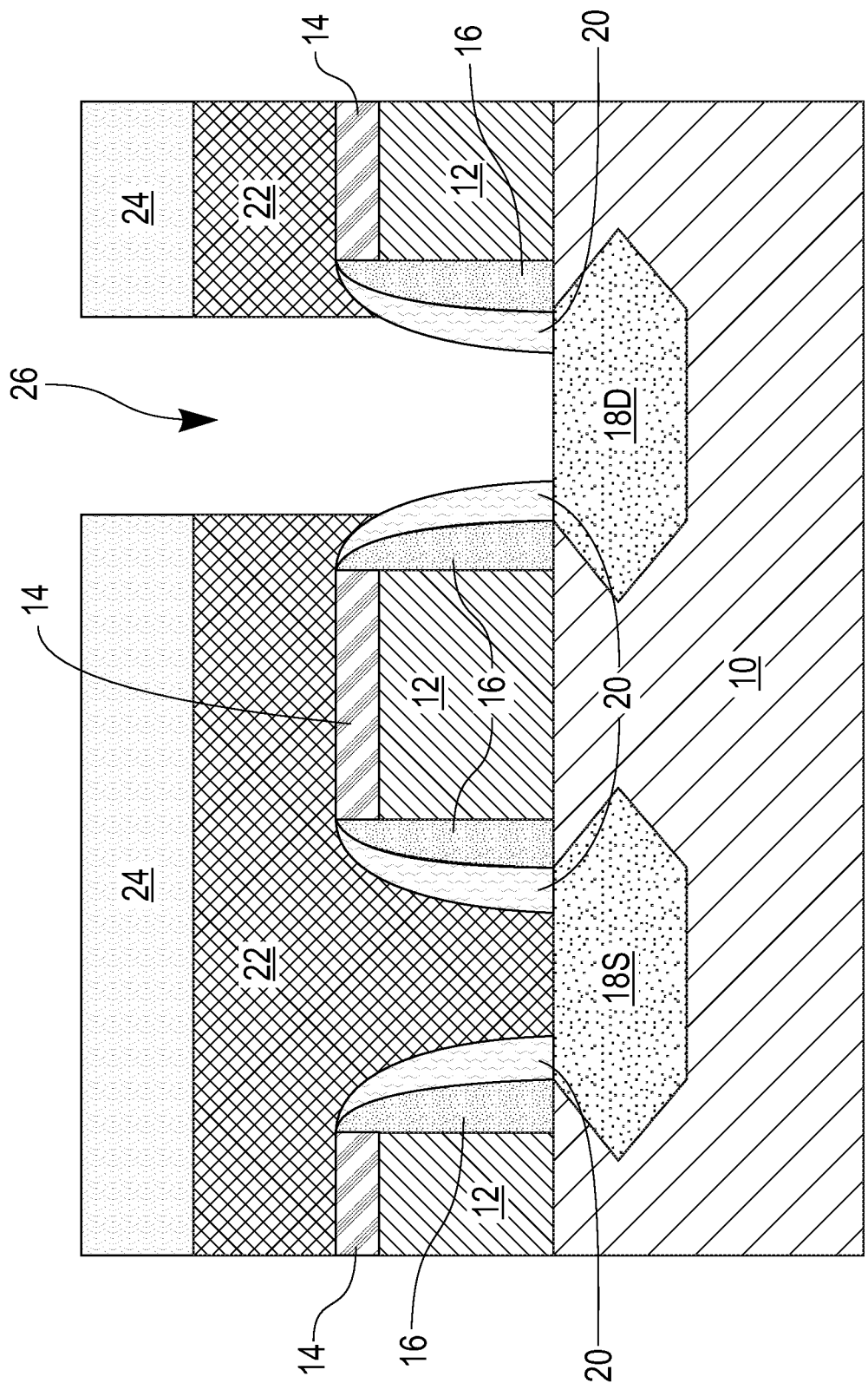
FIG. 4 is a cross sectional view of the exemplary semiconductor structure of FIG. 3 after forming an opening in the ILD material layer which physically exposes a surface of the drain region.

Referring now to FIG. 4, there is illustrated the exemplary semiconductor structure of FIG. 3 after forming an opening 26 within the ILD material layer 22 which physically exposes a surface of the drain region 18D. The opening 26 can be formed by first providing a patterned mask 24 on the ILD material layer 22. The patterned mask 24 may include a hard mask material such as, for example, silicon nitride. The patterned mask 24 may be formed by depositing a blanket layer of the hard mask material, and thereafter patterning the blanket layer of the hard mask material. The patterning of the blanket layer of the hard mask material may include an etch such as, for example, a reactive ion etch. This etch, or a separate etch, may be used to provide the opening 26 in the ILD material layer 22.

Figure 5:
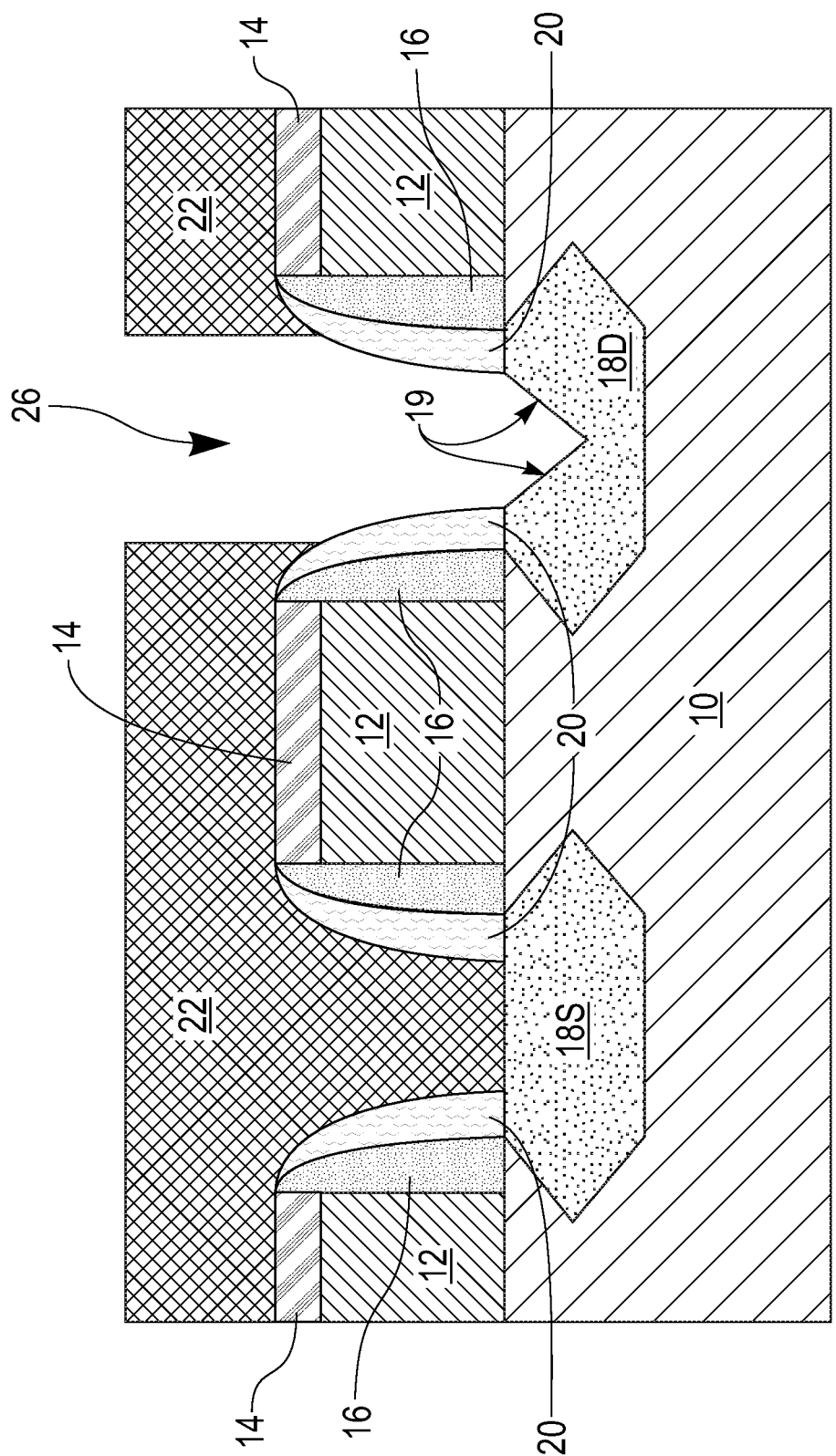
FIG. 5 is a cross sectional view of the exemplary semiconductor structure of FIG. 4 after performing a self-limiting etch into the physically exposed drain region to provide a faceted upper surface to the drain region.

Referring now FIG. 5, there is illustrated the exemplary semiconductor structure of FIG. 4 after performing a self-limiting etch into the physically exposed drain region 18D. The self-limiting etch used in this step of the present application is the same as that mentioned above. The etched drain region 18D has a faceted upper surface 19 defined by an indentation formed in the drain region 18D which will provide a tip region for the subsequently formed ReRAM device. After the self-limiting etching of the drain region 18D, the patterned mask 24 is removed from the structure utilizing any material removal process such as, for example, chemical mechanical polishing (CMP). The source region 18S is not etched during this step of the present application since the patterned mask 24 and the ILD material layer 22 protect the same.

Figure 6:
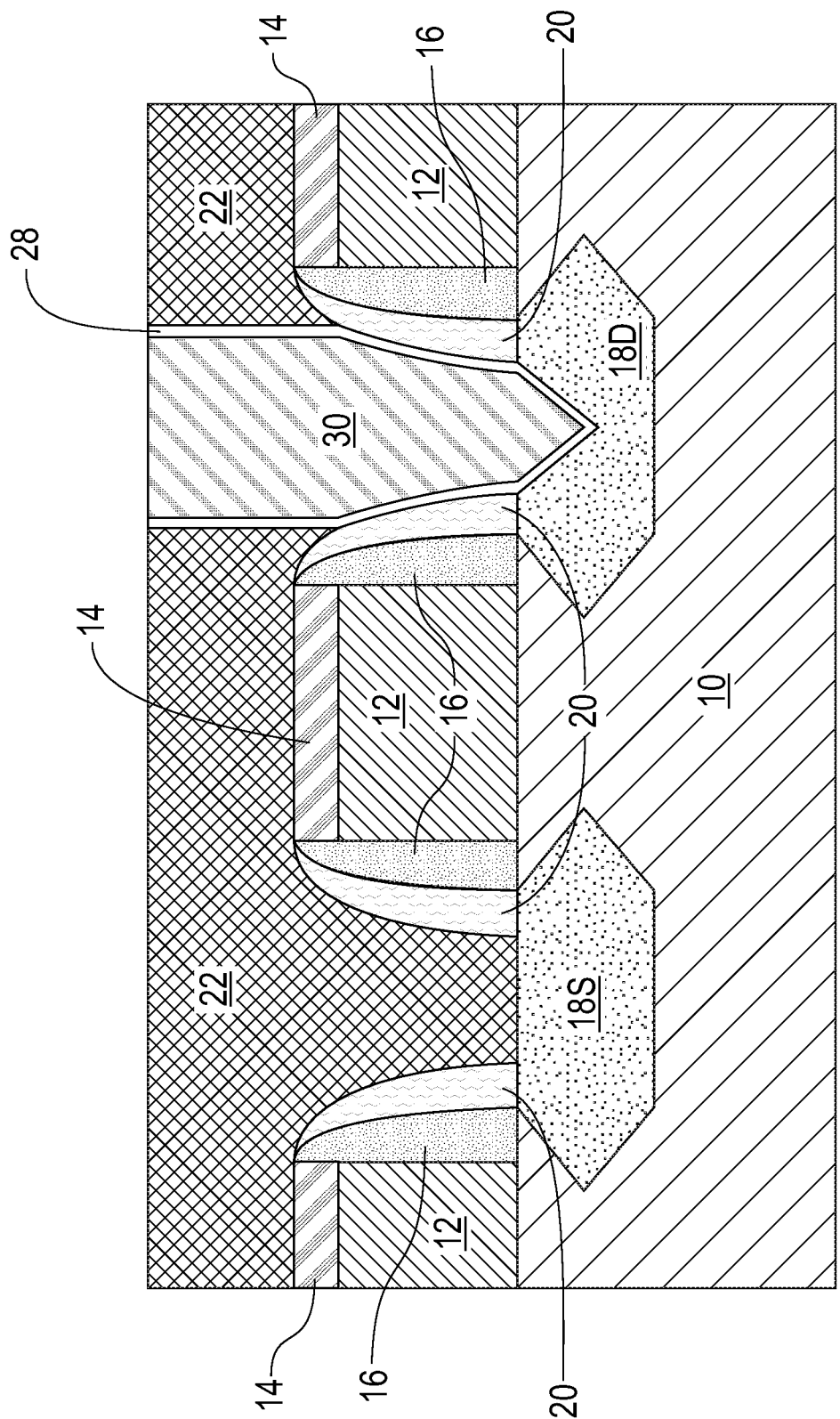
FIG. 6 is a cross sectional view of the exemplary semiconductor structure of FIG. 5 after forming a resistive switching layer and a top electrode material in the opening.

Referring now to FIG. 6, there is illustrated the exemplary semiconductor structure of FIG. 5 after forming a resistive switching layer 28 and a top electrode material 30 in the opening 26. In some embodiments (not shown), a bottom electrode material layer can be formed into the opening 26 prior to forming the resistive switching layer 28 and the top electrode material 30.

When present, the bottom electrode material layer is formed into the opening 26 and a portion of the bottom electrode material layer is in direct physical contact with the faceted upper surface of the drain region 16D'. The bottom electrode material layer may include, for example, a conductive metal, or a conductive metal nitride. The conductive metal that can provide the bottom electrode material layer may include at least one metal selected from Ti, Ta, Ni, Cu, W, Hf, Zr, Nb, Y, Zn, Co, Al, Si, and Ge. The conductive metal nitride the can provide the bottom electrode material layer may include a nitride of at least one metal selected from Ti, Ta, Ni, Cu, W, Hf, Zr, Nb, Y, Zn, Co, Al, Si, and Ge. In one embodiment, the bottom electrode material layer is composed of TiN or an alloy of TiN and TiAlC. The bottom electrode material layer may be formed by a deposition process such as, for example, chemical vapor deposition, plasma enhanced chemical vapor deposition, atomic layer deposition or sputtering. The bottom electrode material layer may have a thickness from 2 nm to 10 nm. Other thicknesses are possible for the bottom electrode material layer as long as bottom electrode material layer does not fill in the entirety of the opening 26.

The resistive switching layer 28 may include an insulating metal oxide. In some embodiments, the insulating metal oxide that provides the resistive switching layer 28 has an energy gap smaller than 5 eV. The insulating metal oxide includes at least one insulating material selected from the group consisting of $TiO_2$, NiO, HfO, $HfO_2$, ZrO, $ZrO_2$, $Ta_2O_5$, ZnO, $WO_3$, CoO and $Nb_2O_5$. Though the present application is not limited thereto, and in other embodiments, the energy gap of the resistive switching layer 28 can be adjusted according to an actual requirement. The resistive switching layer 28 may be formed by a deposition process such as, for example, chemical vapor deposition, plasma enhanced chemical vapor deposition, atomic layer deposition or sputtering. The resistive switching layer 28 may have a thickness from 2 nm to 10 nm. Other thicknesses are possible for the resistive switching layer 28 as long as the resistive switching layer 28 does not fill in the entirety of the opening 26.

Top electrode material 30 is formed on the surface of the resistive switching layer 28. The top electrode material 30 includes one of the conductive metals or conductive metal nitrides mentioned above for the bottom electrode material layer. In some embodiments, the top electrode material 30 and the bottom electrode material are composed of a same conductive metal or conductive metal nitride. In other embodiments, the top electrode material 30 is composed of a different conductive metal or conductive metal nitride than the bottom electrode material. In one embodiment, the top electrode material 30 is composed of TiN, or an alloy of TiN and TiAlC. The top electrode material 30 may be formed by a deposition process such as, for example, chemical vapor deposition, plasma enhanced chemical vapor deposition, atomic layer deposition or sputtering. The top electrode material 30 completely fills in the remaining volume of opening 26.

The structure shown in FIG. 6 can be formed by first depositing the various material layers (i.e., optional bottom electrode material layer, the resistive switching layer 28 and the top electrode material 30) into the opening 26 and atop the ILD material layer 22 and then a planarization process is used to remove the optional bottom electrode material layer, the resistive switching layer 28 and the top electrode material 30 from the topmost surface of the ILD material layer 22.

Figure 7:
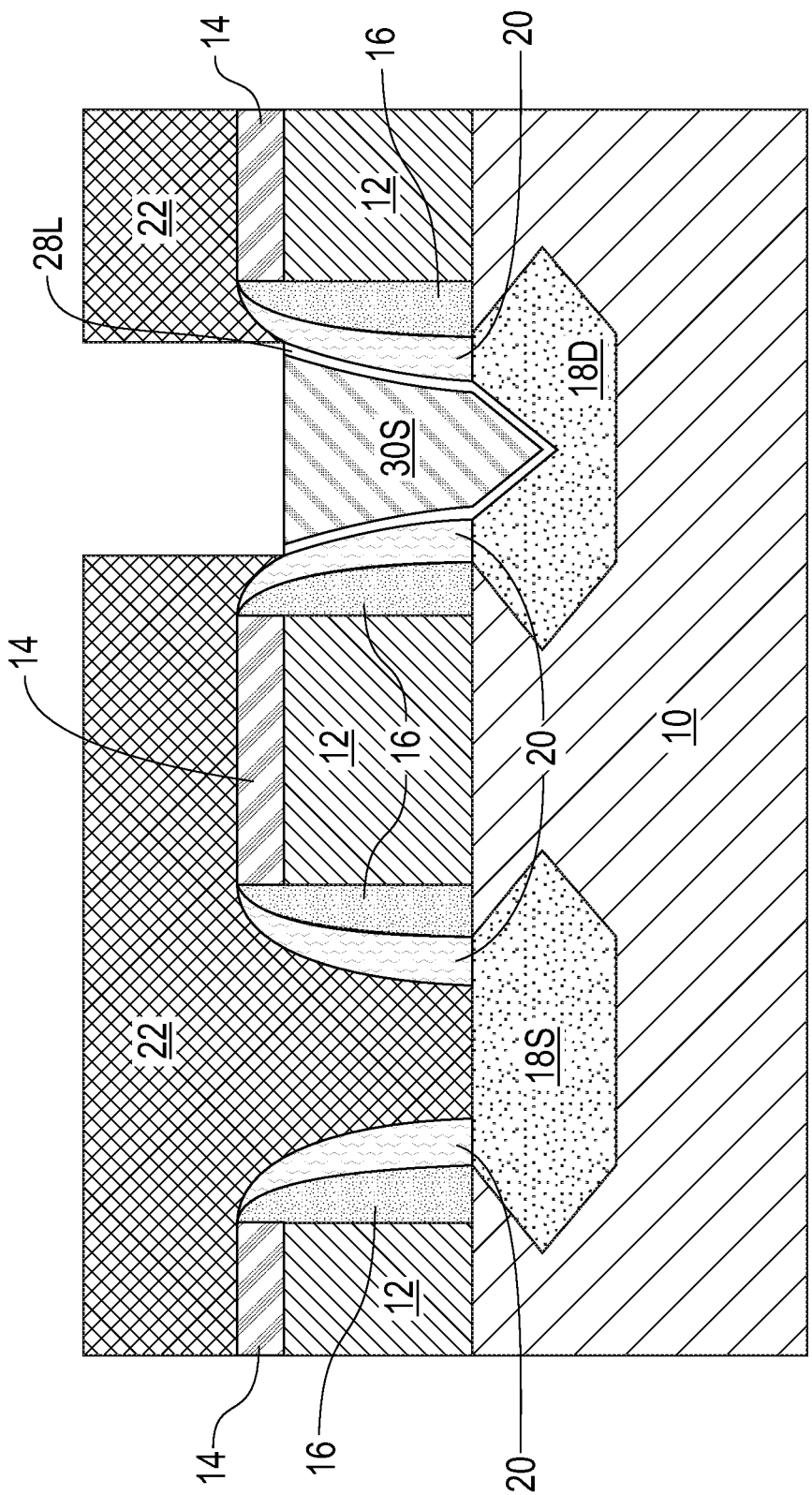
FIG. 7 is a cross sectional view of the exemplary semiconductor structure of FIG. 6 after recessing the resistive switching layer and the top electrode material.

Referring now to FIG. 7, there is illustrated the exemplary semiconductor structure of FIG. 6 after recessing the resistive switching layer 28 and the top electrode material 30 from an upper portion of the opening 26, while maintaining a portion of the resistive switching layer 28 and a portion of the top electrode material 30 within a lower portion of the opening 26. The recessing of the resistive switching layer 28 and the top electrode material 30 from an upper portion of the opening 26 can be performed utilizing one or more anisotropic etching processes such as, for example, reactive ion etching.

The remaining portion of the resistive switching layer 28 may be referred to as a resistive switching liner 28L and the remaining portion of the top electrode material 30 may be referred to herein as a top electrode 30S. In this embodiment, a ReRAM device is provided in the lower portion of the opening 26 that includes an upper portion (i.e., the faceted upper surface 19) of the etched drain region 18D as a bottom electrode, the resistive switching liner 28L, and the top electrode 30S. In some embodiments (see, for example, FIG. 10), the ReRAM device includes a deposited bottom electrode material layer as the bottom electrode, the resistive switching liner 28L, and the top electrode 30S.

In the present application, the resistive switching liner 28L is present directly beneath an entirety of the top electrode 30S, and the resistive switching liner 28L and the top electrode 30S have topmost surfaces that are coplanar with each other. In embodiments in which a bottom electrode composed of a deposited conductive metal or metal nitride is formed (see, for example, FIG. 10), the bottom electrode is present beneath the entirety of the resistive switching liner 28L, and the bottom electrode, the resistive switching liner 28L and the top electrode 30S have topmost surfaces that are coplanar with each other.

Figure 8:
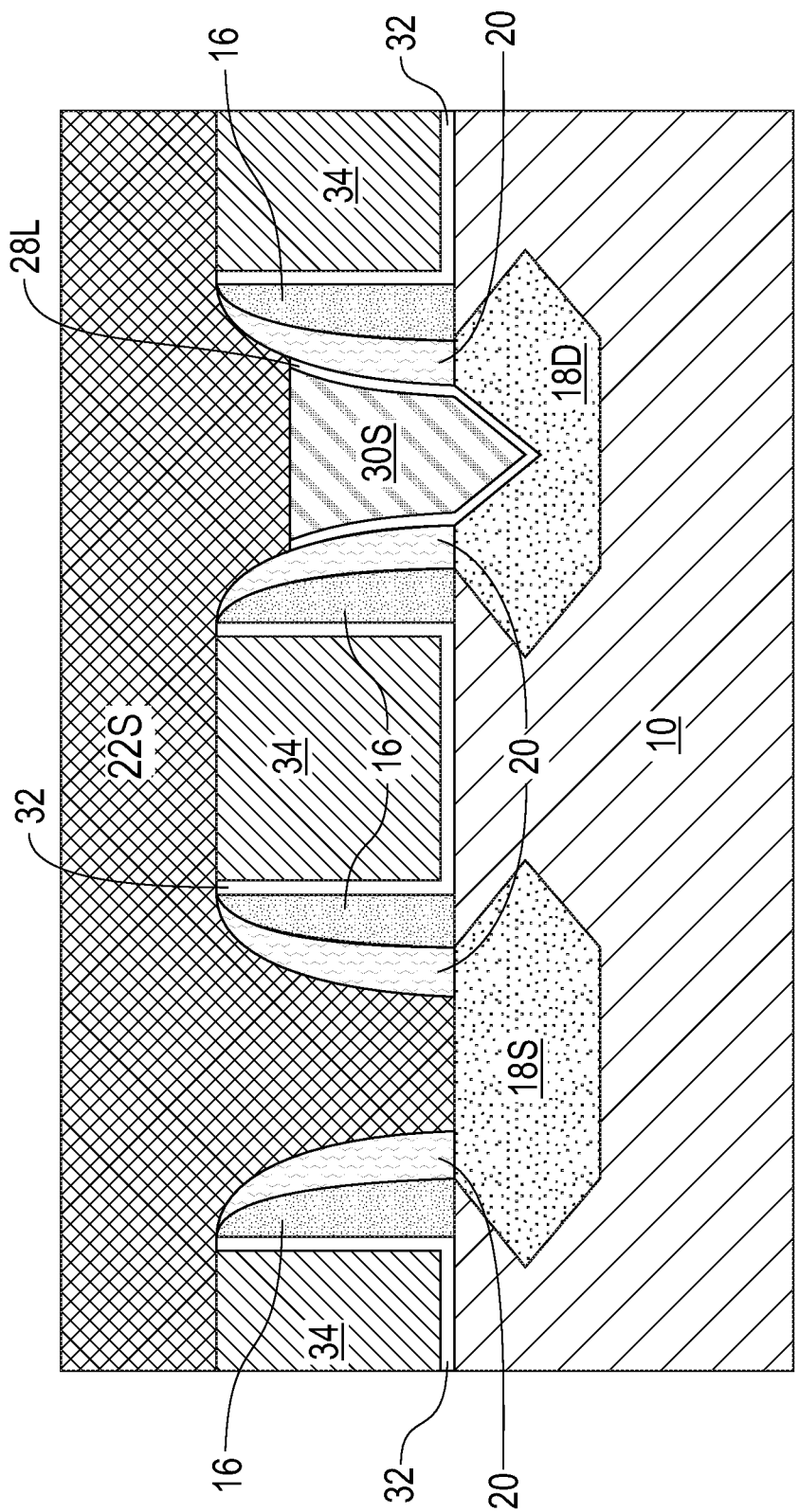
FIG. 8 is a cross sectional view of the exemplary semiconductor structure of FIG. 7 after filling in an upper portion of the opening with additional ILD material and replacing each sacrificial gate structure with a functional gate structure.

Referring now to FIG. 8, there is illustrated the exemplary semiconductor structure of FIG. 7 after filling in the upper portion of the opening 26 with additional ILD material and replacing the sacrificial gate structures 12 with a functional gate structure (32, 34). The additional ILD material is typically a same ILD material as ILD material layer 22. The additional ILD material can be formed utilizing the technique mentioned above for forming the ILD material layer 22. Collectively, the additional ILD material and the ILD material layer 22 may be referred to as ILD material structure 22S.

The sacrificial gate structures 12 and, if present the sacrificial gate cap material 14, are then removed utilizing one of more anisotropic etching process such as, for example, reactive ion etching. During this etch, a portion of the ILD material structure 22S (not shown in the cross sectional views) may be removed prior to removing the sacrificial gate structures 12 and, if present the sacrificial gate cap material 14. Gate cavities (not shown) are formed by removing the sacrificial gate structures 12 and, if present the sacrificial gate cap material 14. A functional gate structure (32, 34) is then formed in the gate cavities. By "functional gate structure" it is meant a permanent gate structure used to control output current (i.e., flow of carriers in the channel) of a semiconducting device through electrical or magnetic fields.

The functional gate structures may include a gate dielectric portion 32 and a gate conductor portion 34. The gate dielectric portion 32 may include a gate dielectric material. The gate dielectric material can be an oxide, nitride, and/or oxynitride. In one example, the gate dielectric material can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric portion 32.

The gate dielectric material can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing can have a thickness in a range from 1 nm to 10 nm. Other thicknesses that are lesser than, or greater than, the aforementioned thickness range can also be employed for the gate dielectric material that may provide the gate dielectric portion 32.

The gate conductor portion 34 may be composed of a gate conductor material. The gate conductor material can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In one embodiment, the gate conductor portion 34 may comprise an nFET gate metal. In another embodiment, the gate conductor portion 34 may comprise a pFET gate metal.

The gate conductor material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material can have a thickness from 50 nm to 200 nm. Other thicknesses that are lesser than, or greater than, the aforementioned thickness range can also be employed for the gate conductor material.

The functional gate structure can be formed by providing a functional gate material stack of the gate dielectric material, and the gate conductor material. A planarization process may follow the formation of the functional gate material stack.

Figure 9:
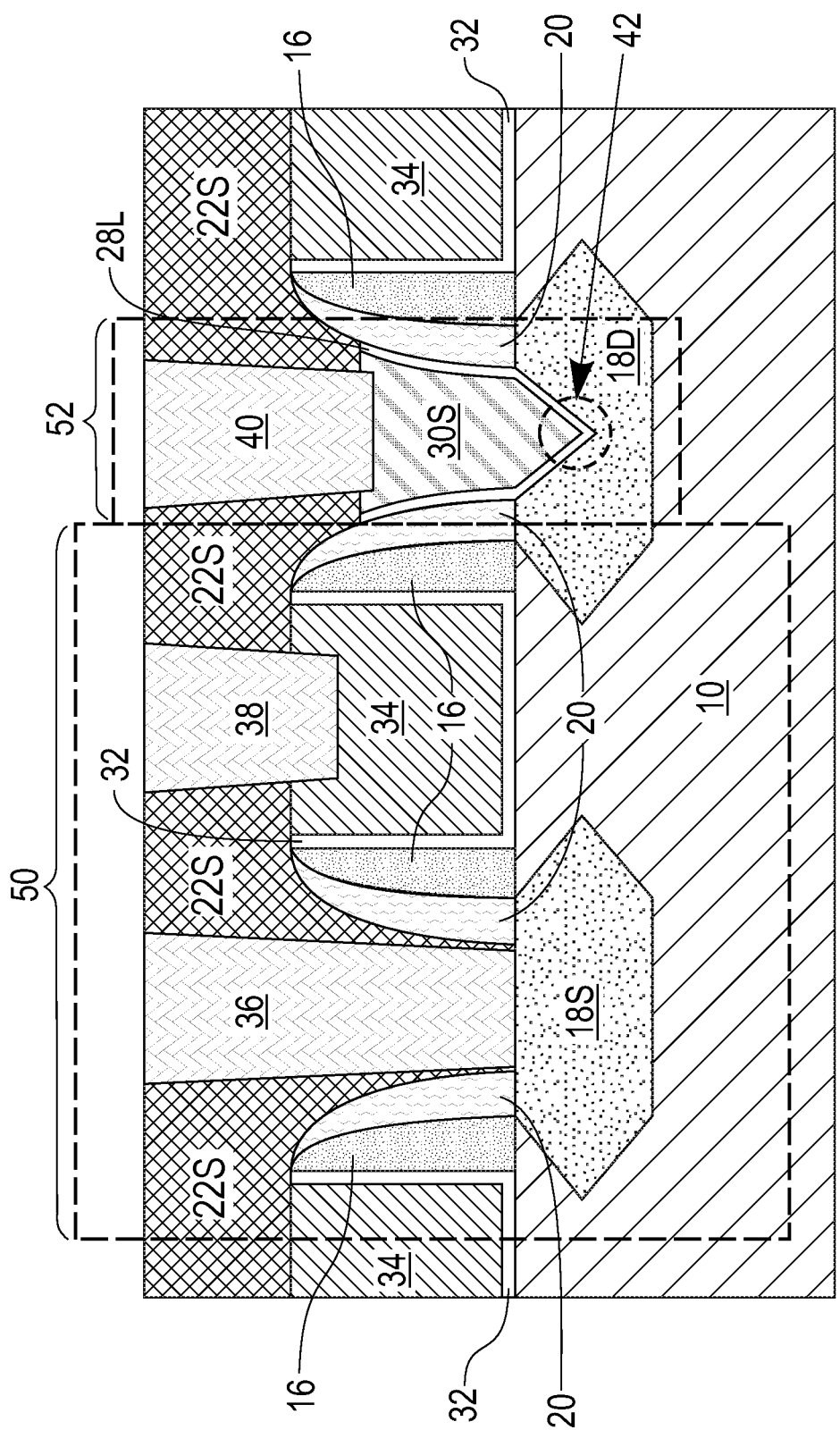
FIG. 9 is a cross sectional view of the exemplary semiconductor structure of FIG. 8 after forming contact structures.

Referring now to FIG. 9, there is illustrated the exemplary semiconductor structure of FIG. 8 after forming contact structures, namely a source contact structure 36, a gate contact structure 38, and a ReRAM contact structure 40 are formed as shown in FIG. 9. The various contact structures (36, 38 and 40) can be formed by first providing contact openings to expose a conductive region (i.e., the source region 18S, the gate conductor portion 34, the top electrode 30S) of the structure. The contact openings can be formed by lithography and etching. Each contact opening is the filled with a contact metal or metal alloy. Examples of contact metals include, but are not limited to, tungsten (W), aluminum (Al), copper (Cu), or cobalt (Co). An example of a contact metal alloy is Cu—Al alloy. A planarization process may follow the filling of each contact opening with the contact metal or metal alloy. The various contact structures (36, 38, 40) are embedded in the ILD material structure 22S.

FIG. 9 represents one exemplary semiconductor structure including an oxide resistive random access memory (ReRAM) device 52 co-integrated with a drain region 18D of a field effect transistor (FET) 50; the FET includes a source region 18S and a functional gate structure (32, 34). The ReRAM device 52 has a tip region 42 defined by a pointed cone that contacts a faceted upper surface 19 of the drain region 18D of the FET 50. The tip region 42 enhances the electroforming of a current conducting filament of the ReRAM device 52. Thus, the randomness of electroforming of the current conducting filament is reduced in the ReRAM device 52 of the present application. As is shown, the ReRAM device 52 is located laterally adjacent the functional gate structure (32, 34) and is spaced apart from the functional gate structure (32, 34) by the first dielectric spacer 16 and the second dielectric spacer 20. As is further shown, the source region 18S and the drain region 18D are embedded in the semiconductor substrate 10 and each has faceted sidewall surfaces.

Figure 10:
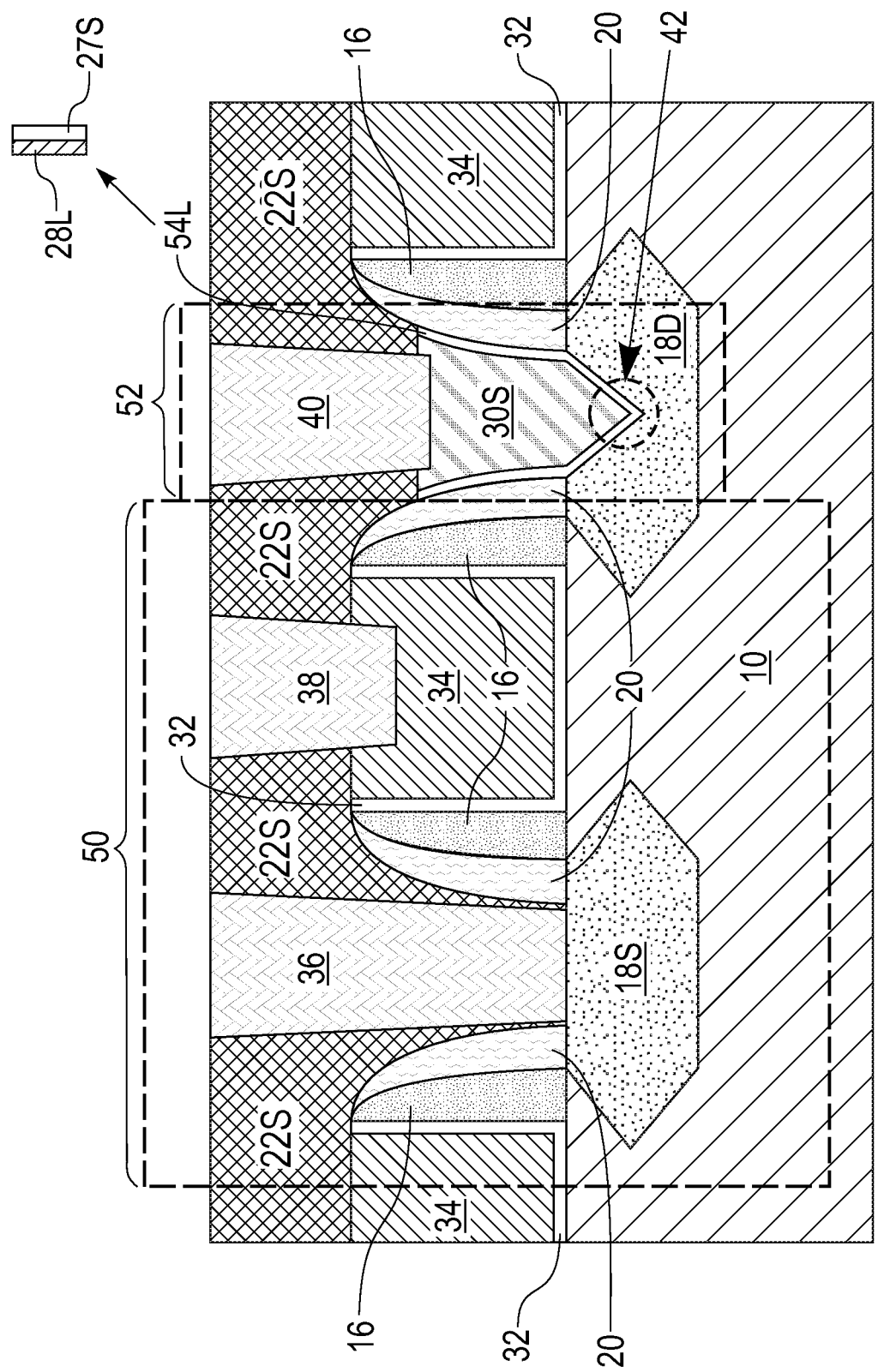
FIG. 10 is a cross sectional view of another exemplary semiconductor structure of the present application including a ReRAM device that includes a bottom electrode, a resistive switching liner, and a top electrode.

Referring now to FIG. 10, there is illustrated another exemplary semiconductor structure of the present application including a ReRAM device 52 that includes a bottom electrode 27S, a resistive switching liner 28L, and a top electrode 30S. In this embodiment, element 54L denotes a material stack that includes the bottom electrode 27S and the resistive switching liner 28L. In this embodiment, the bottom electrode 27S is composed of a deposited bottom electrode material as described above. The exemplary structure of FIG. 10 is formed utilizing the same basic processes steps as described above and as are depicted in FIGS. 1-9. The exemplary structure of FIG. 10 includes an oxide resistive random access memory (ReRAM) device 52 co-integrated with a drain region 18D of a field effect transistor (FET) 50. The ReRAM device 52 has a tip region 42 that contacts the faceted upper surface 19 of the drain region 18D of the FET 50. The tip region 42 enhances the electroforming of a current conducting filament of the ReRAM device 52. Thus, the randomness of electroforming of the current conducting filament is reduced in the ReRAM device 52 of the present application. As is further shown, the source region 18S and the drain region 18D are embedded in the semiconductor substrate 10 and each has faceted sidewall surfaces.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprising:

providing a sacrificial gate structure on a surface of a semiconductor substrate, wherein a first dielectric spacer and a second dielectric spacer laterally surround the sacrificial gate structure;

forming a source region and a drain region in the semiconductor substrate and on opposite sides of the sacrificial gate structure, wherein the source region and the drain region have faceted sidewall surfaces;

performing a self-limiting etch of the drain region to provide a faceted upper surface to the drain region, wherein an interlayer dielectric (ILD) material layer protects the source region during the performing of the self-limiting etch; and forming elements of an oxide resistive random access memory (ReRAM) device in contact with the faceted upper surface of the drain region.

2. The method of claim 1, further comprising replacing, after the forming of the elements of the ReRAM device, the sacrificial gate structure with a functional gate structure, wherein the functional gate structure comprises a gate dielectric material portion and a gate conductor portion.

3. The method of claim 2, further comprising forming a source contact structure contacting the source region, a gate contact structure contacting the gate conductor portion, and a ReRAM contact structure contacting a top electrode of the ReRAM device.

4. The method of claim 1, wherein the forming of the elements of ReRAM device comprises forming a resistive switching layer and a top electrode material, and recessing the resistive switching layer and the top electrode material.

5. The method of claim 1, wherein the forming of the elements of ReRAM device comprises forming a bottom electrode layer, a resistive switching layer and a top electrode material, and recessing the bottom electrode layer, the resistive switching layer and the top electrode material.

6. The method of claim 1, wherein the forming the source region and the drain region comprises performing an etch to provide source/drain trenches into the semiconductor substrate having faceted sidewalls, and filling the source/drain trenches with a doped semiconductor material.

7. The method of claim 1, wherein the ReRAM device has a tip region that contacts the faceted upper surface of the drain region.

8. The method of claim 1, wherein the self-limiting etch comprises an etchant including at least one of tetramethylammonium hydroxide (TMAH), ammonia ($NH_4OH$), and potassium hydroxide (KOH).

9. The method of claim 1, wherein the performing the self-limiting etch of the drain region comprises:

forming the ILD material layer laterally surrounding, and located above, the sacrificial gate structure;

forming an opening in the ILD material layer that physically exposes the drain region; and etching an upper surface of the drain region.

10. A method of forming a semiconductor structure, the method comprising:

providing a sacrificial gate structure on a surface of a semiconductor substrate, wherein a first dielectric spacer and a second dielectric spacer laterally surround the sacrificial gate structure;

forming a source region and a drain region in the semiconductor substrate and on opposite sides of the sacrificial gate structure, wherein the source region and the drain region have faceted sidewall surfaces;

performing a self-limiting etch of the drain region to provide a faceted upper surface to the drain region; and forming elements of an oxide resistive random access memory (ReRAM) device in contact with the faceted upper surface of the drain region, wherein the forming of the ReRAM device comprises forming at least a resistive switching layer and a top electrode material, and recessing the resistive switching layer and the top electrode material.

* * * * *